(12) United States Patent
Wieland et al.

(10) Patent No.: US 9,105,439 B2
(45) Date of Patent: Aug. 11, 2015

(54) PROJECTION LENS ARRANGEMENT

(75) Inventors: Marco Jan Jaco Wieland, Delft (NL); Bert Jan Kampherbeek, Delft (NL); Alexander Hendrik Van Veen, Rotterdam (NL); Pieter Kruit, Delft (NL); Stijn Willem Steenbrink, The Hague (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 13/304,427

(22) Filed: Nov. 25, 2011

(65) Prior Publication Data
US 2012/0061583 A1    Mar. 15, 2012

Related U.S. Application Data

(63) Continuation of application No. 12/393,049, filed on Feb. 26, 2009, now Pat. No. 8,089,056.

(60) Provisional application No. 61/031,594, filed on Feb. 26, 2008.

(51) Int. Cl.
*H01J 37/317*    (2006.01)
*H01J 37/12*     (2006.01)
*B82Y 10/00*     (2011.01)
*B82Y 40/00*     (2011.01)
*H01J 37/30*     (2006.01)

(52) U.S. Cl.
CPC ............. *H01J 37/12* (2013.01); *B82Y 10/00* (2013.01); *B82Y 40/00* (2013.01); *H01J 37/3007* (2013.01); *H01J 37/3177* (2013.01); *H01J 2237/0435* (2013.01); *H01J 2237/121* (2013.01); *H01J 2237/1205* (2013.01); *H01J 2237/151* (2013.01)

(58) Field of Classification Search
CPC ..... H01J 37/147; H01J 37/3177; H01J 37/12; H01J 37/3007; H01J 2237/31774; H01J 2237/15; H01J 2237/04924; H01J 2237/303
IPC ........................................................ H01J 37/147
See application file for complete search history.

(56) References Cited

U.S. PATENT DOCUMENTS 4,419,182 A    12/1983   Westerberg et al.
4,465,934 A     8/1984   Westerberg et al.
(Continued)

FOREIGN PATENT DOCUMENTS

| WO | 2006/004374 A1 | 1/2006 |
| WO | 2006054086 A  | 5/2006 |
| WO | 2007/017255 A1 | 2/2007 |

*Primary Examiner* — Jack Berman
(74) *Attorney, Agent, or Firm* — Hoyng Monegier LLP; David P. Owen

(57) ABSTRACT

The invention relates to a charged particle optical system comprising a beamlet generator for generating a plurality of charged particle beamlets, an electrostatic deflection system for deflecting the beamlets, and a projection lens system for directing the beamlets from the beamlet generator towards the target. The electrostatic deflection system comprises a first electrostatic deflector and a second electrostatic deflector for scanning charged particle beamlets over the target. The second electrostatic deflector is located behind the first electrostatic deflector so that, during operation of the system, a beamlet generated by the beamlet generator passes both of the electrostatic deflectors. During operation of the first and second electrostatic deflectors the system is adapted to apply voltages on the first electrostatic deflector and the second electrostatic deflector of opposite sign.

23 Claims, 3 Drawing Sheets

(56) References Cited

U.S. PATENT DOCUMENTS

| | | | |
|---|---|---|---|
| 4,827,127 A * | 5/1989 | Todokoro | 250/310 |
| 4,859,856 A * | 8/1989 | Groves et al. | 250/398 |
| 5,393,985 A * | 2/1995 | Yamakage et al. | 250/398 |
| 6,617,587 B2 * | 9/2003 | Parker et al. | 250/398 |
| 6,897,458 B2 * | 5/2005 | Wieland et al. | 250/494.1 |
| 7,049,610 B2 * | 5/2006 | Muraki et al. | 250/492.23 |
| 2003/0122091 A1 | 7/2003 | Almogy | |
| 2004/0141169 A1 | 7/2004 | Wieland et al. | |
| 2005/0253093 A1 | 11/2005 | Gorksi et al. | |
| 2008/0023643 A1 | 1/2008 | Kruit et al. | |

* cited by examiner

PROJECTION LENS ARRANGEMENT

CROSS REFERENCE TO RELATED APPLICATIONS

This application is a continuation of U.S. patent application Ser. No. 12/393,049 filed on Feb. 26, 2009, which claims priority from U.S. provisional application No. 61/031,594 filed on Feb. 26, 2008. Both applications are hereby incorporated by reference in their entireties.

BACKGROUND OF THE INVENTION

1. Field of the Invention

The present invention relates to a projection system for a charged particle multi-beamlet system, such as for a charged particle multi beamlet lithography system or an inspection system, and an end module for such a projection system.

2. Description of the Related Art

Currently, most commercial lithography systems use a mask as a means to store and reproduce the pattern data for exposing a target, such as a wafer with a coating of resist. In a maskless lithography system, beamlets of charged particles are used to write the pattern data onto the target. The beamlets are individually controlled, for example by individually switching them on and off, to generate the required pattern. For high resolution lithography systems designed to operate at a commercially acceptable throughput, the size, complexity, and cost of such systems becomes an obstacle.

One type of design used for charged particle multi-beamlet systems is shown for example in U.S. Pat. No. 5,905,267, in which an electron beam is expanded, collimated and split by an aperture array into a plurality of beamlets. The obtained image is then reduced by a reduction electron optical system and projected onto a wafer. The reduction electron optical system focuses and demagnifies all the beamlets together, so that the entire set of beamlets is imaged and reduced in size. In this design, all the beamlets cross at a common cross-over, which introduces distortions and reduction of the resolution due to interactions between the charged particles in the beamlets.

Designs without such a common cross-over have also been proposed, in which the beamlets are focused and demagnified individually. However, when such a system is constructed having a large number of beamlets, providing multiple lenses for controlling each beamlet individually becomes impractical. The construction of a large number of individually controlled lenses adds complexity to the system, and the pitch between the lenses must be sufficient to permit room for the necessary components for each lens and to permit access for individual control signals to each lens. The greater height of the optical column of such a system results in several drawbacks, such as the increased volume of vacuum to be maintained and the long path for the beamlets which increases e.g. the effect of alignment errors caused by drift of the beamlets.

BRIEF SUMMARY OF THE INVENTION

The present invention seeks to improve the known systems and to address such problems by providing a charged particle multi-beamlet system for exposing a target using a plurality of beamlets. The system comprises a first plate having a plurality of holes formed in it, with a plurality of electrostatic projection lens systems formed at the location of each hole so that each electron beamlet passes through a corresponding projection lens system. The holes have sufficiently uniform placement and dimensions to enable focusing of the beamlets onto the surface of the target using a common control voltage.

The projection lens systems and the common focusing voltage preferably comprise all of the focusing means for focusing the beamlets onto the surface. The projection lens systems are preferably controlled by a common control signal to focus the electron beamlets on to the surface without correction of the focus or path of individual electron beamlets. Each electron beamlet is focused by a projection lens system at a focal length, and the placement and dimensions of the holes where the projection lens systems are formed are preferably controlled within a tolerance sufficient to enable focusing of the electron beamlets using a common control voltage to achieve a focal length uniformly better than 0.05%.

In a preferred embodiment, the projection lens systems are spaced apart at a nominal pitch, and each electron beamlet is focused by a projection lens system to form a spot on the surface of the target. The placement and dimensions of the holes are preferably controlled within a tolerance sufficient to achieve a variation in spatial distribution of the spots on the surface of less than 0.2% of the nominal pitch. In one embodiment the holes are substantially round and have a nominal diameter, and wherein the diameters of the holes fall within a tolerance of plus or minus 0.2% of the nominal diameter.

The system preferably includes a second plate having a plurality of holes formed in it corresponding to the holes formed in the first plate, and wherein the electrostatic projection lens systems are formed at the locations of corresponding holes in the first and second plates. The system preferably includes modulation means comprising an array of deflectors, wherein each deflector is adapted for deflecting a beamlet away from its path, and a beamlet stop array for stopping beamlets deflected by the deflectors.

In another aspect, the invention provides a charged particle multi-beamlet system for exposing a target, the system including means for generating a plurality of electron beamlets, at least one plate having a plurality of holes formed therein, and a plurality of electrostatic projection lens systems formed at the location of the holes so that each electron beamlet passes through a corresponding projection lens system. The electrostatic projection lens systems are controlled by a common electrical signal to focus the electron beamlets on the surface without correction of the focus or path of individual electron beamlets.

BRIEF DESCRIPTION OF THE DRAWINGS

Various aspects of the invention will be further explained with reference to embodiments shown in the drawings wherein.

DESCRIPTION OF ILLUSTRATIVE EMBODIMENTS

The following is a description of an embodiment of the invention, given by way of example only and with reference to the drawings.

Figure 1:
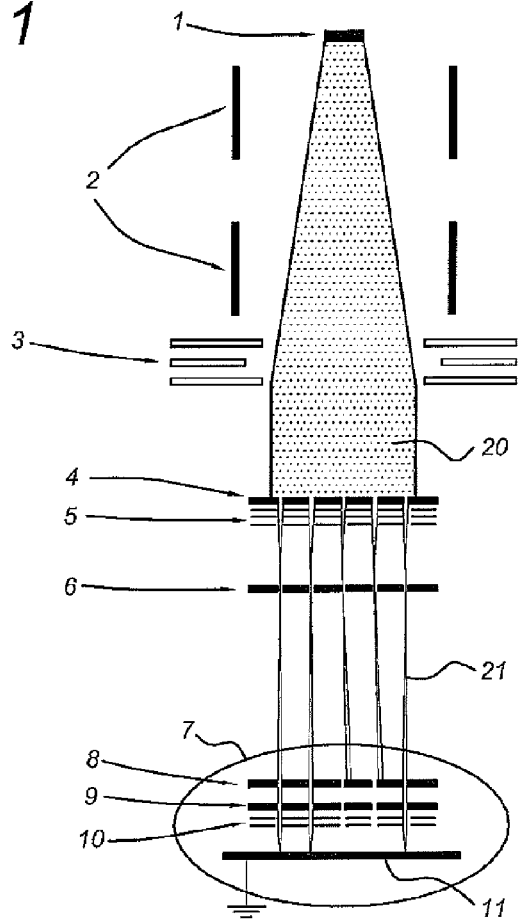
FIG. 1 is a simplified schematic overview of an example of a charged particle multi beamlet lithography system.

FIG. 1 shows a simplified schematic drawing of an embodiment of a charged particle multi-beamlet lithography system based upon an electron beam optical system without a common cross-over of all the electron beamlets. Such lithography systems are described for example in U.S. Pat. Nos. 6,897,458 and 6,958,804 and 7,084,414 and 7,129,502 which are all hereby incorporated by reference in their entirety, assigned to the owner if the present invention. In the embodiment shown in FIG. 1, the lithography system comprises an electron source 1 for producing a homogeneous, expanding electron beam 20. Beam energy is preferably maintained relatively low in the range of about 1 to 10 keV. To achieve this, the acceleration voltage is preferably low, the electron source preferably kept at between about −1 to −10 kV with respect to the target at ground potential, although other settings may also be used.

The electron beam 20 from the electron source 1 passes a double octopole 2 and subsequently a collimator lens 3 for collimating the electron beam 20. Subsequently, the electron beam 20 impinges on an aperture array 4, which blocks part of the beam and allows a plurality of beamlets 21 to pass through the aperture array 4. The aperture array preferably comprises a plate having through holes. Thus, a plurality of parallel electron beamlets 21 is produced. The system generates a large number of beamlets 21, preferably about 10,000 to 1,000,000 beamlets, although it is of course possible to use more or less beamlets. Note that other known methods may also be used to generate collimated beamlets.

The plurality of electron beamlets 21 pass through a condenser lens array 5 which focuses each of the electron beamlets 21 in the plane of a beam blanker array 6. This beamlet blanker array 6 preferably comprises a plurality of blankers which are each capable of deflecting one or more of the electron beamlets 21.

Subsequently, the electron beamlets 21 enter the end module 7. The end module 7 is preferably constructed as an insertable, replaceable unit which comprises various components. In this embodiment, the end module comprises a beam stop array 8, a beam deflector array 9, and a projection lens arrangement 10, although not all of these need be included in the end module and they may be arranged differently. The end module 7 will, amongst other functions, provide a demagnification of about 100 to 500 times, preferably as large as possible, e.g. in the range 300 to 500 times. The end module 7 preferably deflects the beamlets as described below. After leaving the end module 7, the beamlets 21 impinge on a surface of a target 11 positioned at a target plane. For lithography applications, the target usually comprises a wafer provided with a charged-particle sensitive layer or resist layer.

In the end module 7, the electron beamlets 21 first pass beam stop array 8. This beam stop array 8 largely determines the opening angle of the beamlets. In this embodiment, the beam stop array comprises an array of apertures for allowing beamlets to pass through. The beam stop array, in its basic form, comprises a substrate provided with through holes, typically round holes although other shapes may also be used. In one embodiment, the substrate of the beam stop array 8 is formed from a silicon wafer with a regularly spaced array of through holes, and may be coated with a surface layer of a metal to prevent surface charging. In one embodiment, the metal is of a type which does not form a native-oxide skin layer, such as CrMo.

In one embodiment, the passages of the beam stop array 8 are aligned with the elements of the beam blanker array 6. The beamlet blanker array 6 and beam stop array 8 operate together to block or let pass the beamlets 21. If beamlet blanker array 6 deflects a beamlet, it will not pass through the corresponding aperture in beam stop array 8, but instead will be blocked by the substrate of beam stop array 8. But if beamlet blanker array 6 does not deflect a beamlet, then it will pass through the corresponding aperture in beam stop array 8 and will then be projected as a spot on the surface of target 11.

Next, the beamlets pass through a beam deflector array 9 which provides for deflection of each beamlet 21 in the X and/or Y direction, substantially perpendicular to the direction of the undeflected beamlets 21. Next, the beamlets 21 pass through projection lens arrangement 10 and are projected onto a target 11, typically a wafer, in a target plane.

For consistency and homogeneity of current and charge both within a projected spot and among the projected spots on the target, and as beam stop plate 8 largely determines the opening angle of a beamlet, the diameter of the apertures in beam stop array 8 are preferably smaller than the diameter of the beamlets when they reach the beam stop array. In one embodiment, the apertures in beam stop array 8 have a diameter are in a range of 5 to 20 μm, while the diameter of the beamlets 21 impinging on beam stop array 8 in the described embodiment are typically in the range of about 30 to 75 μm.

The diameter of the apertures in beam stop plate 8 in the present example limit the cross section of a beamlet, which would otherwise be of a diameter value within the range of 30 to 75 μm, to the above stated value within the range of 5 to 20 μm, and more preferably within the range of 5 to 10 μm. In this way, only a central part of a beamlet is allowed to pass through beam stop plate 8 for projection onto target 11. This central part of a beamlet has a relatively uniform charge density. Such cut-off of a circumferential section of a beamlet by the beam stop array 8 also largely determines the opening angle of a beamlet in the end module 7 of the system, as well as the amount of current at the target 11. In one embodiment, the apertures in beam stop array 8 are round, resulting in beamlets with a generally uniform opening angle.

Figure 2:
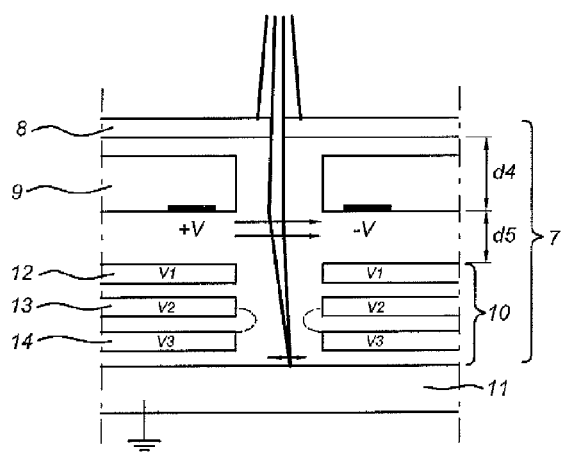
FIG. 2 a simplified schematic overview, in side view, of an end module of the lithography system of FIG. 1.

FIG. 2 shows an embodiment of end module 7 in more detail, showing the beam stop array 8, the deflection array 9, and the projection lens arrangement 10, projecting an electron beamlet onto a target 11. The beamlets 21 are projected onto target 11, preferably resulting in a geometric spot size of about 10 to 30 nanometers in diameter, and more preferably about 20 nanometers. The projection lens arrangement 10 in such a design preferably provides a demagnification of about 100 to 500 times. In this embodiment, as shown in FIG. 2, a central part of a beamlet 21 first passes through beam stop array 8 (assuming it has not been deflected by beamlet blanker array 6). Then, the beamlet passes through a deflector or set of deflectors arranged in a sequence forming a deflection system, of beam deflector array 9. The beamlet 21 subsequently passes through an electro-optical system of projection lens arrangement 10 and finally impinges on a target 11 in the target plane.

The projection lens arrangement 10, in the embodiment shown in FIG. 2, has three plates 12, 13 and 14 arranged in sequence, used to form an array of electrostatic lenses. The plates 12, 13, and 14 preferably comprise substrates with apertures formed in them. The apertures are preferably formed as round holes though the substrate, although other shapes can also be used. In one embodiment, the substrates are formed of silicon or other semiconductor processed using process steps well-known in the semiconductor chip industry. The apertures can be conveniently formed in the substrates using lithography and etching techniques known in the semiconductor manufacturing industry, for example. The lithography and etching techniques used are preferably controlled sufficiently precisely to ensure uniformity in the position, size, and shape of the apertures. This uniformity permits the elimination of the requirement to individually control the focus and path of each beamlet.

Uniformity in the positioning of the apertures, i.e. a uniform distance (pitch) between the apertures and uniform arrangement of the apertures over the surface of the substrate, permits the construction of a system with densely packed beamlets which generate a uniform grid pattern on the target. In one embodiment, where the pitch between the apertures is in the range 50 to 500 microns, the deviation in the pitch is preferably 100 nanometers or less. Furthermore, in systems where multiple plates are used, the corresponding apertures in each plate are aligned. Misalignment in the apertures between plates may cause a difference in focal length along different axes.

Uniformity in the size of the apertures enables uniformity in the electrostatic projection lenses formed at the locations of the apertures. Deviation in the size of the lenses will result in deviation in the focusing, so that some beamlets will be focused on the target plane and others will not. In one embodiment, where the size of the apertures in the range of 50 to 150 microns, the deviation in the size is preferably 100 nanometers or less.

Uniformity in the shape of the apertures is also important. Where round holes are used, uniformity in the roundness of the holes results in the focal length of the resulting lens being the same in both axes.

The substrates are preferably coated in an electrically conductive coating to form electrodes. The conductive coating preferably forms a single electrode on each substrate covering both surfaces of the plate around the apertures and inside the holes. A metal with a conductive native oxide is preferably used for the electrode, such as molybdenum, deposited onto the plate using techniques well known in the semiconductor manufacturing industry, for example. An electrical voltage is applied to each electrode to control the shape of the electrostatic lenses formed at the location of each aperture. Each electrode is controlled by a single control voltage for the complete array. Thus, in the embodiment shown with three electrodes lens there will be only three voltages for all the thousands of lenses.

Figure 6:
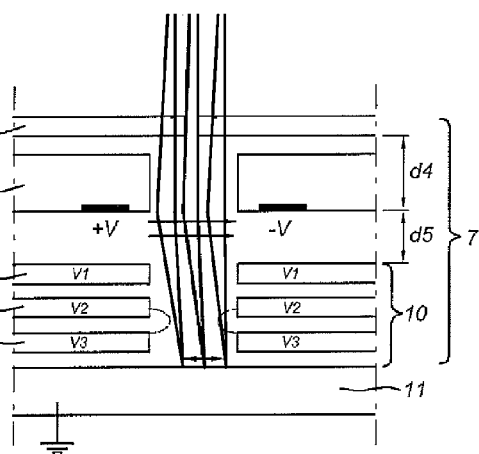
FIG. 6 is a simplified schematic overview, in side view, of another embodiment of the end module of the lithography system of FIG. 1.

FIGS. 2 and 6 shows the plates 12, 13, and 14 having electric voltages V1, V2 and V3 respectively applied to their electrodes. The voltage differences between the electrodes of plates 12 and 13, and between plates 13 and 14, create electrostatic lenses at the location of each aperture in the plates. This generates a "vertical" set of electrostatic lenses at each position in the array of apertures, mutually aligned, creating an array of projection lens systems. Each projection lens system comprises the set of electrostatic lenses formed at corresponding points of the arrays of apertures of each plate. Each set of electrostatic lenses forming a projection lens system can be considered as a single effective projection lens, which focuses and demagnifies one (FIG. 2) or more (FIG. 6) beamlets, and has an effective focal length and an effective demagnification. In systems where only a single plate is used, a single voltage may be used in conjunction with a ground plane, such that electrostatic lenses are formed at the location of each aperture in the plate.

Variation in the uniformity of the apertures will result in variation in the electrostatic lenses forming at the locations of the apertures. The uniformity of the apertures results in uniform electrostatic lenses. Thus, the three control voltages V1, V2, and V3 create an array of uniform electrostatic lenses which focus and demagnify the large number of electron beamlets 21. The characteristics of the electrostatic lenses are controlled by the three control voltages, so that the amount of focusing and demagnification of all of the beamlets can be controlled by controlling these three voltages. In this way, a single common control signal can be used to control a whole array of electrostatic lenses for demagnifying and focusing a very large number of electron beamlets. A common control signal may be provided for each plate or as a voltage difference between two or more plates. The number of plates used in different projection lens arrangements may vary, and the number of common control signals may also vary. Where the apertures have sufficiently uniform placement and dimensions, this enables the focusing of the electron beamlets, and demagnification of the beamlets, using one or more common control signals. In the embodiment of FIG. 2, three common signals comprising the three control voltages V1, V2, and V3 are thus used to focus and demagnify all of the beamlets 21.

The projection lens arrangement preferably forms all of the focusing means for focusing the beamlets onto the target surface. This is made possible by the uniformity of the projection lenses, which provide sufficiently uniform focusing and demagnification of the beamlets so that no correction of the focus and/or path of individual electron beamlets is required. This considerably reduces the cost and complexity of the overall system, by simplifying construction of the system, simplifying control and adjustment of the system, and greatly reducing the size of the system.

In one embodiment, the placement and dimensions of the apertures where the projection lenses are formed are controlled within a tolerance sufficient to enable focusing of the electron beamlets using one or more common control signals to achieve a focal length uniformity better than 0.05%. The projection lens systems are spaced apart at a nominal pitch, and each electron beamlet is focused to form a spot on the surface of the target. The placement and dimensions of the apertures in the plates are preferably controlled within a tolerance sufficient to achieve a variation in spatial distribution of the spots on the surface of the target of less than 0.2% of the nominal pitch.

The projection lens arrangement 10 is compact with the plates 12, 13, 14 being located close to each other, so that despite the relatively low voltages used on the electrodes (in comparison to voltages typically used in electron beam optics), it can produce very high electrical fields. These high electrical fields generate electrostatic projection lenses which have a small focal distance, since for electrostatic lenses the focal length can be estimated as proportional to beam energy divided by electrostatic field strength between the electrodes. In this respect, where previously 10 kV/mm could be realized, the present embodiment preferably applies potential differences within the range of 25 to 50 kV/mm between the second plate 13 and third plate 14. These voltages V1, V2, and V3 are preferably set so that the difference in voltage between the second and third plates (13 and 14) is greater than the difference in voltage between first and second plates (12 and 13). This results in stronger lenses being formed between plates 13 and 14 so that the effective lens plane of each projection lens system is located between plates 13 and 14, as indicated in FIG. 2 by the curved dashed lines between plates 13 and 14 in the lens opening. This places the effective lens plane closer to the target and enables the projection lens systems to have a shorter focal length. It is further noted that while, for simplicity, the beamlet in FIG. 2 is shown focused as from the deflector 9, a more accurate representation of the focusing of beamlet 21 is shown in FIG. 3B.

The electrode voltages V1, V2, and V3 are preferably set so that voltage V2 is closer to the voltage of the electron source 1 than is voltage V1, causing a deceleration of the charged particles in beamlet 21. In one embodiment, the target is at 0V (ground potential) and the electron source is at about −5 kV relative to the target, voltage V1 is about −4 kV, and voltage V2 is about −4.3 kV. Voltage V3 is at about 0V relative to the target, which avoids a strong electric field between plate 14 and the target which can cause disturbances in the beamlets if the topology of the target is not flat. The distances between the plates (and other components of the projection system) are preferably small. With this arrangement, a focusing and demagnifying projection lens is realized, as well as a reduction in the speed of extracted charged particles in the beamlets. With the electron source at a voltage of about −5 kV, charged particles are decelerated by the central electrode (plate 13), and subsequently accelerated by the bottom electrode (plate 14) having a voltage at ground potential. This deceleration permits the use of lower electrical fields on the electrodes while still achieving the desired demagnification and focusing for the projection lens arrangement. An advantage of having three electrodes with control voltages V1, V2 and V3, rather than only two electrodes with control voltages V1 and V2 as used in previous systems is that control of the focusing of the beamlets is decoupled to some extent from control of the beamlet acceleration voltage. This decoupling occurs because the projection lens systems can be adjusted by adjusting the voltage differential between voltages V2 and V3 without changing voltage V1. Thus the voltage differential between voltage V1 and the source voltage is largely unchanged so that the acceleration voltage remains essentially constant, reducing the alignment consequences in the upper part of the column.

FIGS. 2 and 6 also illustrates deflection of a beamlet 21 (FIG. 2) or beamlets 21 (FIG. 6) by deflection array 9 in the Y-direction, illustrated in FIGS. 2 and 6 as a deflection of the beamlet from left to right. In the embodiment of FIGS. 2 and 6, an aperture in deflection array 9 is shown for one (FIG. 2) or more (FIG. 6) beamlets to pass through, and electrodes are provided on opposite sides of the aperture, the electrodes provided with a voltage +V and −V. Providing a potential difference over the electrodes causes a deflection of the beamlet or beamlets passing though the aperture. Dynamically changing the voltages (or the sign of the voltages) will allow the beamlet(s) to be swept in a scanning fashion, here in the Y-direction.

In the same way as described for deflection in the Y-direction, deflection in the X-direction may also be performed back and/or forth (in FIG. 2 the X-direction is in a direction into and out of the paper). In the embodiment described, one deflection direction may be used for scanning the beamlets over the surface of a substrate while the substrate is translated in another direction using a scanning module or scanning stage. The direction of translation is preferably transverse to the Y-direction and coinciding with the X-direction.

The arrangement of the deflectors and lenses of the end module 7 with respect to one another as described differs from what has generally been expected in the art of particle optics. Typically, a deflector is located after a projection lens, so that the focusing is accomplished first and then the focused beamlet is deflected. First deflecting a beamlet and then focusing it, as in the system in FIGS. 2 and 3, results in the beamlet entering the projection lens off axis and at an angle with respect to the optical axis of the projection lens. It is evident to the person skilled in the art that the latter arrangement may give rise to considerable off-axis aberrations in the deflected beamlet.

In the application of the projection system for lithography, a beamlet should be focused and positioned at ultra high precision, with spot sizes of tens of nanometers, with an accuracy in size of nanometers, and a position accuracy in the order of nanometers. The inventors realized that deflecting a focused beamlet, for example several hundreds of nanometers away from the optical axis of a beamlet, would easily result in an out-of-focus beamlet. In order to meet the accuracy requirements, this would severely limit the amount of deflection or the beamlet would rapidly become out of focus at the surface of target 11.

As discussed above, in order to achieve the objectives of the projection lens arrangement in view of its use in a lithography system, the effective focal length of the projection lens systems is short, and the lens plane of the projection lens systems is positioned very close to the target plane. Thus, there is very little space left between the projection lens and the target plane for a beamlet deflection system. The inventors recognized that the focal length should be of such limited magnitude that any deflector or deflector system should be located before the projection lens despite the evident occurrence of off-axis aberrations with such an arrangement.

The arrangement shown in FIGS. 1 and 2 of the deflection array 9 upstream and projection lens arrangement 10 downstream furthermore allows a strong focusing of beamlet 21, in particular to permit a reduction in size (demagnification) of the beamlets of at least about 100 times, and preferably about 350 times, in systems where each projection lens system focuses only one beamlet (or a small number of beamlets). In systems where each projection lens system focuses a group of beamlets, preferably from 10 to 100 beamlets, each projection lens system provides demagnification of at least about 25 times, and preferably about 50 times. This high demagnification has another advantage in that requirements as to the precision of the apertures and lenses before (upstream of) the projection lens arrangement 10 are much reduced, thereby enabling construction of the lithography apparatus, at a reduced cost. Another advantage of this arrangement is that the column length (height) of the overall system can be greatly reduced. In this respect, it is also preferred to have the focal length of the projection lens small and the demagnification factor large, so as to arrive to a projection column of limited height, preferably less than one meter from target to electron source, and more preferably between about 150 and 700 mm in height. This design with a short column makes the lithography system easier to mount and house, and it also reduces the effect of drift of the separate beamlets due to the limited column height and shorter beamlet path. The smaller drift reduces beamlet alignment problems and enables a simpler and less costly design to be used. This arrangement, however, puts additional demands on the various components of the end module.

With a deflection system located upstream of a projection system, the deflected beamlets will no longer pass through the projection system at its optical axis. Thus, an undeflected beamlet which was focused on the target plane will now be out-of-focus at the target plane when deflected. In order to limit the out-of-focus effect due to deflection of the beamlets, in the end module of one embodiment the deflection array 9 is positioned as close as possible to the projection lens array 10.

In this way, deflected beamlets will still be relatively close to their undeflected optical axis when they pass through the projection lens array. Preferably the deflection array is positioned at about 0 to 5 mm from the projection lens array 10, or preferably as close as possible while maintaining isolation from the projection lens. In a practical design, to accommodate wiring, a distance of 0.5 mm may be used. An alternative embodiment also provides another means to cope with this problem, as described below with respect to FIG. 5.

With an arrangement as described above, the main lens plane of the projection lens system 10 is preferably located between the two plates 13 and 14. The overall energy of the charged particles in the system according to the embodiments described above is kept relatively low, as mentioned previously. For an electron beam, for example, the energy is preferably in the range of up to about 10 keV. In this way, generation of heat at the target is reduced. However, with such low energy of the charged particles, chromatic aberration in the system increases. This requires specific measures to counteract this detrimental effect. One of these is the already mentioned relatively high electrostatic field in the projection lens arrangement 10. A high electrostatic field results in forming electrostatic lenses having a low focal length, so that the lenses have low chromatic aberration.

Chromatic aberration is generally proportional to the focal length. In order to reduce chromatic aberration and provide a proper projection of electron beams onto the target plane, the focal length of the optical system is preferably limited to one millimeter or less. Furthermore, the final plate 14 of the lens system 10 according to the present invention is made very thin to enable a small focal length without the focal plane being inside the lens. The thickness of plate 14 is preferably within the range of about 50 to 200 µm.

It is desired to keep the acceleration voltage relatively low for reasons mentioned above, to obtain a relatively strong demagnification, and to maintain the aberration as low as possible. In order to meet these contradictory requirements, an arrangement is conceived having the lenses of the projection lens system positioned closely together. This new concept requires the lower electrode 14 of the projection lens preferably being provided as close as possible to the target plane, with the effect that the deflector is preferably located before the projection lens. Another measure to mitigate the aberrations caused by the arrangement of the end module 7 is to locate the deflector 9 and the projection lens arrangement 10 at minimal mutual distance.

Figure 3A:
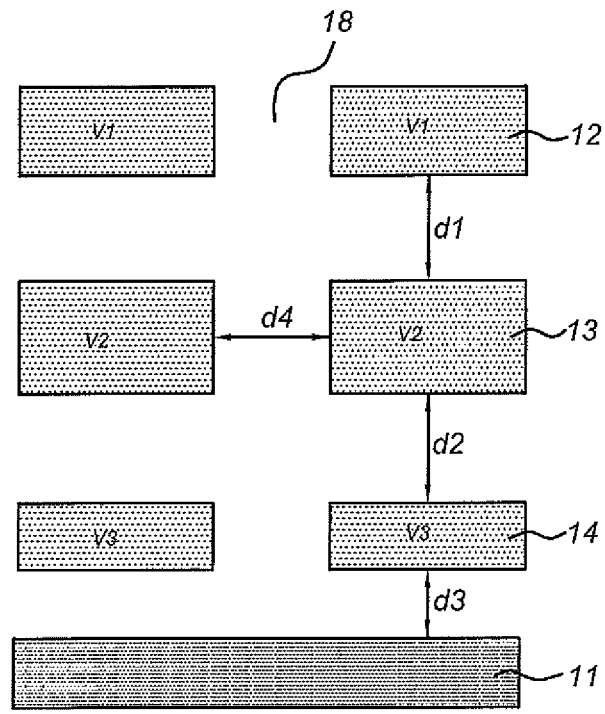
FIG. 3A is a simplified schematic representation, in side view, of voltages and mutual distances of lens arrays in a projection lens of the end module of FIG. 2.
Figure 3B:
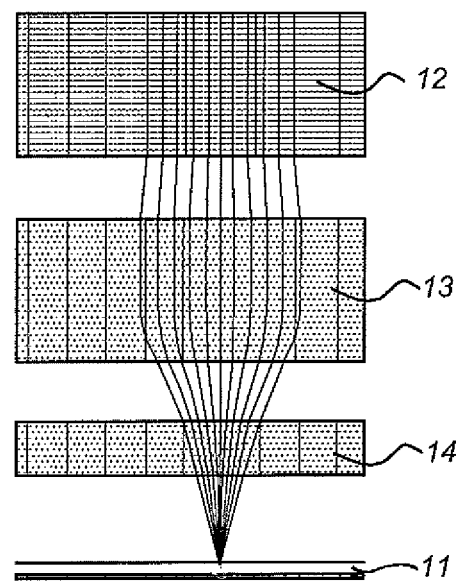
FIG. 3B schematically illustrates the effect of the projection lens of FIG. 2 on a beamlet, as shown in vertical cross section.

FIG. 3A illustrates the mutual distances in a lens array which, as indicated above, are of a highly miniaturized nature. In this respect the mutual distances d1 and d2 between the plates 12 and 13 are in the same order of magnitude as the thickness of the plate 13. In a preferred embodiment the thicknesses d1 and d2 are in a range of about 100 to 200 µm. Distance d3 of final plate 14 to the target plane is preferably smaller than distance d2 to allow for a short focal length. However, a minimal distance is required between the lower surface of plate 14 and surface of the wafer to provide allowance for mechanical movement of wafer. In the presently exemplified embodiment d3 is about 50 to 100 µm. In one embodiment, d2 is about 200 µm, and d3 is about 50 µm. These distances are related to the voltages V1, V2, and V3, and the size d4 of the apertures 18 of the lenses of plates 12, 13 and 14 for allowing deflected beamlets to pass while focusing one or more beamlets.

In the design of an end module 7 as illustrated, the diameter d4 of the apertures of the lenses of the plates 12, 13 and 14, is a number of times larger than the diameter of the coaxially aligned apertures of beam stop array 8, which preferably have a diameter of about 5 to 20 µm. Diameter d4 is preferably in range of about 50 to 150 µm. In one embodiment, the diameter d4 is about 100 µm and the diameter of the apertures of the beam stop array is about 15 µm.

Furthermore, in the present design, the central substrate of plate 13 has the largest thickness, preferably in the range of about 50 to 500 µm. The thickness of the substrate for plate 12 is relatively smaller, preferably about 50 to 300 µm, and for plate 14 relatively smallest, preferably about 50 to 200 µm. In one embodiment, the thickness of the substrate for plate 13 is about 200 µm, for 12 is about 150 µm, and for 14 is about 150 µm.

FIG. 3B illustrates the actual focusing effect of a lens according to the embodiment of FIG. 3A, by means of a so-called traced ray illustration in a cross section of aperture 18 of projection lens arrangement 10. This picture illustrates that in this embodiment the actual lens plane of lens system 10 is between plates 13 and 14. It should also be noted that the distance d3 between lowermost plate 14 and target plane 11 should be very small in this design to allow for the short focal length.

Figure 4:
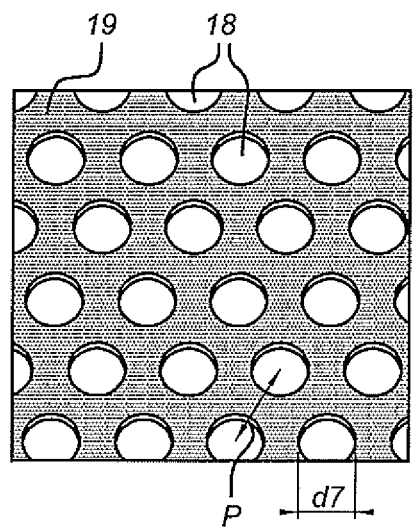
FIG. 4 is a perspective view of a substrate of a lens array of projection lens of FIG. 2.

FIG. 4 is a perspective view of one of the plates 12, 13 or 14, which preferably comprise a substrate, preferably of a material such as silicon, provided with holes 18. The holes may be arranged in triangular (as shown) or square or other suitable relationship with mutual distance P (pitch) between the centre of neighboring holes of about one and a half times the diameter d7 of a hole 18. The substrates of the plates according to one embodiment may be about 20-30 mm square, are preferably located at a constant mutual distance over their entire area. In one embodiment, the substrate is about 26 mm square.

The total current of the beamlets required to achieve a particular throughput (i.e. a particular number of wafers exposed per hour) depends on the required dose, the area of the wafer, and the overhead time. The required dose in these shot noise limited systems depends on the required feature size and uniformity, and beam energy, among other factors.

To obtain a certain feature size (critical dimension or CD) in resist using electron beam lithography, a certain resolution is required. This resolution is determined by three contributions: beam size, the scattering of electrons in the resist, and secondary electrons mean free path combined with acid diffusion. These three contributions add up in a quadratic relation to determine the total spot size. Of these three contributions the beam size and the scattering depend on the acceleration voltage. To resolve a feature in the resist the total spot size should be of the same order of magnitude as the desired feature size (CD). Not only the CD but also the CD uniformity is important for practical applications, and this latter requirement will determine the actual required spot size.

For electron beam systems the maximum single beam current is determined by the spot size. For small spot size the current is also very small. To obtain a good CD uniformity, the required spot size will limit the single beam current to much less than the current required to obtain a high throughput. Thus a large number of beamlets is required (typically more than 10,000 for a throughput of 10 wafers per hour). For an electron beam system, the total current through one lens is limited by Coulomb interactions, so that a limited number of beams can be sent through one lens and/or one cross-over point. This consequently means that the number of lenses in a high throughput system also needs to be large.

In the embodiment described, a very dense arrangement of a large number of low energy beams is achieved, such that the multiple beamlets can be packed into an area comparable in size to the size of a typical wafer exposure field.

The pitch of the holes is preferably as small as possible to create as many electrostatic lenses as possible in a small area. This enables a high density of beamlets, and reduces the distance the beamlets must be scanned across on the target surface. However, reduction in the pitch for a given bore size of the holes is limited by manufacturing and structural problems caused when the plate becomes too fragile due to the small distances between the holes, and by possible aberrations caused by fringe fields of neighboring lenses.

Figure 5:
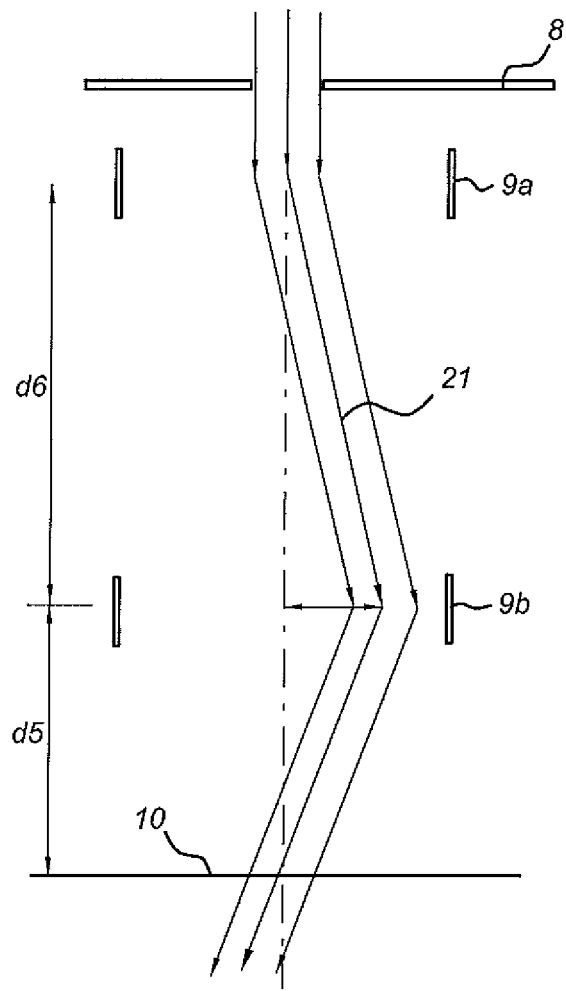
FIG. 5 is a simplified schematic representation in cross section of an alternative embodiment of a deflection system of an end module.

FIG. 5 is an illustration of an alternative design of a deflector, intended to further mitigate the effect of the arrangement of the end module 7. With this design it is accomplished that a beamlet 21 passes through the centre part of the effective lens plane of projection lens arrangement 10 even when deflected. In this manner, spherical aberrations caused by deflection through the projection lens arrangement 10 are minimized. An important improvement with this design is that the amount of deflection that can be used is increased, while the resolution of the spot size is not compromised.

In the alternative design according to FIG. 5, two deflectors 9a and 9b are located one behind the other, each with opposite voltages on their electrodes. For deflection purposes the sign of these voltages on each deflector 9a, 9b is switched simultaneously. Centering of deflected beamlet 21 in the effective lens plane 10, and near the optical axis of the projection system, is performed by fine tuning the ratio's of the deflection angles in view of distance d5 between deflector 9b and the effective lens of projection lens arrangement 10 in combination with the mutual distance d6 between the two deflectors 9a and 9b, and the voltages applied on the electrodes. The voltages on electrodes 9a and 9b are mutually changed in such a way that the pivot point of beamlet 21 is in the optical plane of projection lens arrangement 10 and crosses the optical axis (shown as a dot-striped line in FIG. 5) of the projection lens system. Thus, first deflector 9a deflects beamlet 21 at an angle alpha1 away from the optical axis, and deflector 9b deflects the beamlet 21 back in the opposite direction and at angle alpha2. In that way, beamlet 21 is deflected over an angle alpha3 when crossing the effective lens plane of projection lens arrangement 10.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. A charged particle optical system for exposing a target using a plurality of charged particle beamlets projected on the target without a common cross-over of all the beamlets, the system comprising:
    a beamlet generator for generating a plurality of charged particle beamlets;
    a beam blanker array comprising blankers for blanking one or more of the charged particle beamlets;
    a beam stop array comprising a substrate provided with an array of apertures, the diameter of the apertures of the beam stop array being such that, during operation, it determines the cross section of beamlets that pass through the apertures of the beam stop array;
    an electrostatic deflection system for scanning the charged particle beamlets over the target, the deflection system located downstream from the beam stop array;
    a projection lens arrangement for projecting the charged particle beamlets onto the target, the projection lens arrangement located downstream from the deflector array;
    wherein the electrostatic deflection system comprises a first electrostatic deflector and a second electrostatic deflector for scanning charged particle beamlets over the target, the second electrostatic deflector being located behind the first electrostatic deflector so that, during operation of the system, a beamlet generated by the beamlet generator passes both of the electrostatic deflectors;
    wherein, during operation of the first and second electrostatic deflectors, the system is adapted to apply voltages on the first electrostatic deflector and the second electrostatic deflector of opposite sign, and the voltages applied to the first and second deflectors are mutually changed in such a way that the pivot point of beamlets is in the optical plane of projection lens arrangement and the beamlets cross the optical axis the projection lens system;
    wherein the projection lens arrangement comprises first, second and third projection lens plates, each plate having a plurality of holes formed in it in an array and each plate having an electrode adapted to receive a common control voltage applied to each plate; and
    wherein the projection lens plates are adapted for forming an array of electrostatic projection lens systems at the location of the holes in the projection lens plates when control voltages are applied, each projection lens system comprising projection lenses formed at corresponding holes of the projection lens plates.

2. System according to claim 1, wherein the applied voltages on the first electrostatic deflector and the second electrostatic deflector are simultaneously switchable during deflection of the charged particle beamlets.

3. System according to claim 1, wherein, during operation, a beamlet from the beamlet generator has an optical axis, the first electrostatic deflector being adapted to deflect the beamlet by a first angle away from the optical axis and the second electrostatic deflector being adapted to deflect the beamlet back in an opposite direction and at a second angle.

4. System according to claim 3, wherein, during operation, the beamlet deflected by the first and second electrostatic deflectors is deflected over a third angle when crossing the effective lens plane of the projection lens system.

5. System according to claim 1, wherein, during operation, a deflected beamlet passes through a centre part of an effective lens plane of the projection lens system near an optical axis thereof.

6. System according to claim 5, wherein a pivot point of the beamlet is in the projection system.

7. System according to claim 6, wherein the beamlet crosses the optical axis of the projection lens system at the pivot point.

8. System according to claim 1, wherein the beamlet generator comprises a source for generating a beam, and an aperture array for creating a plurality of beamlets from the generated beam.

9. System according to claim 8, wherein the beamlet generator further comprises a collimator lens for collimating the generated beam, and the aperture array is arranged for creating a plurality of parallel beamlets.

10. System according to claim 1, wherein, during operation of the system, the first electrostatic deflector is arranged for deflecting beamlets in a first direction, and the second electrostatic deflector is arranged for deflecting the beamlets in a second direction opposite to the first direction.

11. System according to claim 1, wherein each projection lens system is adapted for focusing and demagnifying a group of the beamlets, the demagnification of at least about 25 times.

12. System according to claim 1, wherein the deflector array is positioned within about 5 mm from the projection lens arrangement while maintaining isolation from the projection lens arrangement.

13. Method of deflecting a charged particle beamlet in a charged particle optical system, the method comprising the steps of:

generating a plurality of charged particle beamlets;
blanking one or more of the charged particle beamlets;
passing unblanked ones of the charged particle beamlets through apertures of a beam stop array, the diameter of the apertures of the beam stop array being such that it determines the cross section of beamlets that pass through the apertures of the beam stop array;
deflecting the unblanked charged particle beamlets for scanning the beamlets over the target using an electrostatic deflection system located downstream from the beam stop array;
projecting the unblanked charged particle beamlets onto the target using a projection lens arrangement located downstream from the deflector array;
wherein deflecting the unblanked charged particle beamlets comprises passing a beamlet through a first electrostatic deflector and a second electrostatic deflector located behind the first electrostatic deflector, applying voltages on the first electrostatic deflector and the second electrostatic deflector of opposite sign, and mutually changing the voltages applied to the first and second deflectors to pivot the deflected beamlets so that a pivot point of the deflected beamlets is in the optical plane of projection lens arrangement and the beamlets cross the optical axis the projection lens system;
wherein projecting the unblanked charged particle beamlets comprises applying a common control voltage to first, second and third projection lens plates, each plate having a plurality of holes formed in it in an array and each plate having an electrode adapted to receive a common control voltage, to form an array of electrostatic projection lens systems at the location of the holes in the projection lens plates, each projection lens system comprising projection lenses formed at corresponding holes of the projection lens plates.

14. Method according to claim 13, wherein applying the voltages to the first and second electrostatic deflectors comprises simultaneously switching the voltages during deflection of the charged particle beamlets.

15. Method according to claim 13, wherein deflecting the unblanked charged particle beamlets comprises deflecting the beamlets by a first angle away from the optical axis and deflecting the beamlets back in an opposite direction and at a second angle.

16. Method according to claim 13, wherein deflecting the unblanked charged particle beamlets comprises deflecting the beamlets over a third angle when crossing the effective lens plane of the projection lens system.

17. Method according to claim 13, wherein deflecting the unblanked charged particle beamlets comprises deflecting the beamlets through a centre part of an effective lens plane of the projection lens system near an optical axis thereof.

18. Method according to claim 17, wherein a pivot point of the beamlet is in the projection system.

19. Method according to claim 18, wherein the beamlet crosses the optical axis of the projection lens system at the pivot point.

20. A charged particle optical system for exposing a target using a plurality of charged particle beamlets projected on the target without a common cross-over of all the beamlets, the system comprising:

a beamlet generator for generating a plurality of charged particle beamlets;
a beam blanker array comprising blankers for blanking one or more of the charged particle beamlets;
a beam stop array comprising a substrate provided with an array of apertures, the diameter of the apertures of the beam stop array being such that, during operation, it determines the cross section of beamlets that pass through the apertures of the beam stop array;
an electrostatic deflection system for scanning the charged particle beamlets over the target, the deflection system located downstream from the beam stop array;
a projection lens arrangement for projecting the charged particle beamlets onto the target, the projection lens arrangement located downstream from the deflector array;
wherein the electrostatic deflection system comprises a first electrostatic deflector and a second electrostatic deflector for scanning charged particle beamlets over the target, the second electrostatic deflector being located behind the first electrostatic deflector so that, during operation of the system, a beamlet generated by the beamlet generator passes both of the electrostatic deflectors;
wherein the projection lens arrangement comprises first, second and third projection lens plates, each plate having a plurality of holes formed in it in an array and each plate having an electrode adapted to receive a common control voltage applied to each plate; and
wherein the projection lens plates are adapted for forming an array of electrostatic projection lens systems at the location of the holes in the projection lens plates when control voltages are applied, each projection lens system comprising projection lenses formed at corresponding holes of the projection lens plates and forming a single effective projection lens with an effective lens plane;
wherein, during operation of the first and second electrostatic deflectors, the system is adapted to apply voltages on the first electrostatic deflector and the second electrostatic deflector of opposite sign, and the voltages applied to the first and second deflectors are mutually changed in such a way that the beamlets pass through a centre part of the effective lens plane of a corresponding projection lens system even when deflected.

21. System according to claim 20, wherein, during operation, a beamlet from the beamlet generator has an optical axis, the first electrostatic deflector being adapted to deflect the beamlet by a first angle away from the optical axis and the second electrostatic deflector being adapted to deflect the beamlet back in an opposite direction and at a second angle.

22. System according to claim 21, wherein, during operation, the beamlet deflected by the first and second electrostatic deflectors is deflected over a third angle when crossing the effective lens plane of the corresponding projection lens system.

23. System according to claim 20, wherein each projection lens system is adapted for focusing and demagnifying a group of the beamlets.

* * * * *